US007678430B2

(12) United States Patent
Rius et al.

(10) Patent No.: US 7,678,430 B2
(45) Date of Patent: Mar. 16, 2010

(54) METHOD AND DEVICE FOR MICROWAVE PLASMA DEPOSITION OF A COATING ON A THERMOPLASTIC CONTAINER SURFACE

(75) Inventors: Jean-Michel Rius, Octeville sur Mer (FR); Yann Pernel, Octeville sur Mer (FR)

(73) Assignee: Sidel Participations, Octeville sur Mer (FR)

( * ) Notice: Subject to any disclaimer, the term of this patent is extended or adjusted under 35 U.S.C. 154(b) by 994 days.

(21) Appl. No.: 10/536,902

(22) PCT Filed: Nov. 25, 2003

(86) PCT No.: PCT/FR03/03485

§ 371 (c)(1),
(2), (4) Date: May 27, 2005

(87) PCT Pub. No.: WO2004/052060

PCT Pub. Date: Jun. 17, 2004

(65) Prior Publication Data
US 2006/0062931 A1    Mar. 23, 2006

(30) Foreign Application Priority Data
Nov. 28, 2002   (FR)   .................................. 02 14961

(51) Int. Cl.
  *C23C 16/00* (2006.01)
(52) U.S. Cl. .................................. 427/569; 118/723 R
(58) Field of Classification Search .................... None
  See application file for complete search history.

(56) References Cited
U.S. PATENT DOCUMENTS 4,495,117 A * 1/1985 Feurer et al. ............... 264/1.36

| 4,866,346 | A | * | 9/1989 | Gaudreau et al. | ...... 315/111.21 |
| 5,311,103 | A | * | 5/1994 | Asmussen et al. | ...... 315/111.81 |
| 5,707,486 | A | * | 1/1998 | Collins | ................. 156/345.49 |
| 5,834,744 | A | * | 11/1998 | Risman | ....................... 219/697 |
| 6,057,645 | A | | 5/2000 | Pingree et al. | |
| 6,117,496 | A | | 9/2000 | Koike et al. | |

(Continued)

FOREIGN PATENT DOCUMENTS

EP    0 778 089 A    6/1997

(Continued)

OTHER PUBLICATIONS

Applicant arguments over JP National phase entry rejection.*

(Continued)

*Primary Examiner*—Timothy H Meeks
*Assistant Examiner*—Joseph Miller, Jr.
(74) *Attorney, Agent, or Firm*—Sughrue Mion, PLLC

(57) ABSTRACT

The deposition of a coating on a thermoplastic container surface using low pressure plasma by excitation of a precursor gas with UHF electromagnetic waves in a circular shaped vacuum cavity receiving the container is provided. It includes dimensioning the cavity with respect to the frequency of the UHF electromagnetic waves so as to obtain a coupling mode generating several electromagnetic fields inside the cavity. In particular a TM 120 coupling mode is provided which generates two central fields ($4_A$, $4_B$) inside the cavity, whereby two containers can be simultaneously treated in said cavity.

6 Claims, 1 Drawing Sheet

U.S. PATENT DOCUMENTS

| | | | |
|---|---|---|---|
| 6,152,070 A | * | 11/2000 | Fairbairn et al. ............ 118/719 |
| 6,328,805 B1 | * | 12/2001 | Rius ........................... 118/715 |
| 2001/0011654 A1 | * | 8/2001 | Schmidt et al. ............. 219/746 |
| 2003/0097986 A1 | * | 5/2003 | Moore et al. ................ 118/722 |
| 2006/0150909 A1 | * | 7/2006 | Behle et al. ................. 118/719 |

FOREIGN PATENT DOCUMENTS

| | | | |
|---|---|---|---|
| FR | 2 776 540 A | | 10/1999 |
| WO | WO99/17334 | * | 9/1997 |
| WO | WO01/48788 | * | 7/2001 |

OTHER PUBLICATIONS

Japanese Office Action for corresponding JP Patent Application No. 2004-556425 dated Mar. 30, 2009.

Genzaburoh Kuraishi "Microwave Circuit" Japan, Tokyo Denki University Publishing Section, pp. 83 to 89, Mar. 30, 1989.

* cited by examiner

METHOD AND DEVICE FOR MICROWAVE PLASMA DEPOSITION OF A COATING ON A THERMOPLASTIC CONTAINER SURFACE

The present invention relates to improvements made in the field of the deposition of a coating on a face of a thermoplastic container using a low-pressure plasma by excitation of a precursor gas by UHF electromagnetic waves in a circular vacuum chamber (or reactor) containing said container.

The invention applies more particularly to a deposition of a barrier layer inside bottles or pots made of a thermoplastic, such as PET, so as to improve the gas barrier properties, with regard to internal gases or external gases, and possibly to improve the isolation from the outside of the product with which said bottles or pots are filled.

A device for depositing such a coating using a low-pressure plasma by excitation of a precursor gas by means of UHF electromagnetic waves has been described and illustrated in document FR 2 799 994. The UHF generator is connected to the chamber via a UHF waveguide, which runs into a window of the side wall of the chamber, with a TM 020 coupling mode that generates an axial central field in the chamber. To undergo the treatment envisioned, the container to be treated is therefore placed at the center of the chamber in a quartz envelope coaxial with the chamber.

In an industrial production machine, several (typically 20) devices are joined together on a rotating structure capable of treating about 10,000 bottles per hour.

These machines are satisfactory as regards the quality of the containers obtained.

However, there is a keen interest for users to have a higher treatment rate.

An increase in rate could admittedly be achieved by installing a larger number of devices on the rotating structure. However, this increase in the number of devices could be rendered possible only by increasing the dimensions of the rotating structure. This would result in a larger, heavier and therefore more expensive machine, which is unacceptable.

Likewise, the operation of a second machine running in parallel with the first would admittedly allow the rate to be doubled, but here again this would result in bigger space required and a higher cost, which are unacceptable.

The object of the invention is consequently to improve the existing devices, leading to a machine that is more efficient in terms of production while still maintaining acceptable size and an acceptable cost.

For this purpose, according to a first of its aspects, the invention proposes a method for depositing a coating on one face of a container made of a thermoplastic using a low-pressure plasma by excitation of a precursor gas by UHF electromagnetic waves in a circular vacuum chamber containing said container, which method is, according to the invention, characterized in that the chamber is sized in relation to the frequency of the UHF electromagnetic waves so as to obtain a coupling mode that generates several electromagnetic fields inside the chamber, whereby it is possible for several respective containers to be simultaneously treated in the same chamber. In a preferred embodiment, a TM 120 coupling mode is established, which generates two symmetrical fields inside the chamber, these fields themselves having two separate energy regions, whereby it is possible for two containers to be simultaneously treated in said chamber, this method offering the advantage of being able to be implemented in a simple manner in conjunction with commercially available magnetrons operating at a frequency of 2.455 GHz.

Thus, thanks to the method of the invention, it is possible to double the container treatment rate solely by an arrangement of the currently known means, and therefore relatively inexpensively.

According to a second of its aspects, the invention proposes, for implementing the aforementioned method, a device for depositing a coating on one face of a container made of a thermoplastic using a low-pressure plasma by excitation of a precursor gas by UHF electromagnetic waves in a circular vacuum chamber containing said container, which device comprises a UHF wave generator and a UHF waveguide for connecting said generator to a window in the side wall of the chamber, which device, being designed in accordance with the invention, is characterized in that the chamber is sized in relation to the frequency of the UHF electromagnetic waves in order to establish a TM 120 coupling mode that generates two symmetrical fields in the cavity, these fields themselves having two separate energy regions, whereby it is possible for two containers to be simultaneously treated in said chamber.

In a preferred practical embodiment, the generator emits an electromagnetic wave having a frequency $f=2.455$ GHz and the diameter of the chamber is approximately 273 mm. The generator is a magnetron commonly employed in other fields. As regards the diameter of the chamber, this is perfectly compatible with the structures of the current machines. It therefore proves possible, through a simple modification of the current machines, to double the treatment capacity of the machines, since the diameter of the chamber permits simultaneous treatment of two bottles of half-liter or smaller size placed side by side in the respective two central fields.

Particularly advantageously, the chamber contains two quartz envelopes placed respectively so as to be approximately coaxial with the two abovementioned symmetrical fields, the chamber includes a single window for injecting the UHF waves, the window being located symmetrically straddling the plane of symmetry on each side of which the two central fields are situated, and a single cover for closing off the chamber is equipped with a single coupler for connection to a vacuum source, which is divided into two in order to be connected to the abovementioned two respective envelopes, with two precursor gas injectors that are connected to a single precursor gas source and with two support means for the two respective containers, in such a way that using the provisions of the invention does not entail having to duplicate the necessary equipment (such as pressure sensors on the inside and the outside of the container).

It is advantageous for the device to also include bottom and top plates, the position of each of which can be adjusted, these plates being suitable for acting on the respective return fields so as to refine the coupling according to the various types of container that can be treated.

Within the context of the specifically preferred application envisioned, the device is designed for coating the inside of containers and for this purpose, the precursor gas injectors are designed to sit inside the respective containers when the latter are supported by the support means in the envelopes.

The invention will be more clearly understood on reading the detailed description that follows of a preferred embodiment, most particularly suitable for coating the inside of containers, and given solely by way of nonlimiting example. In this description, reference will be made to the appended drawings in which:

FIG. 1 shows schematically a chamber 1 having the general shape of a cylinder of revolution, which has, in its side wall, an opening 2 through which a waveguide connected to a UHF electromagnetic wave generator (not shown) enters.

The UHF generator is a magnetron operating at a frequency of 2.455 GHz.

In order to be able to treat several containers 3 (the two containers 3 are shown schematically in dotted lines) simultaneously in the chamber 1, the dimensions of the chamber are chosen in relation to the frequency of the UHF electromagnetic waves, so as to obtain a coupling mode that generates several electromagnetic fields inside the chamber, each container 3 being placed coaxially in a respective field.

Figure 1:
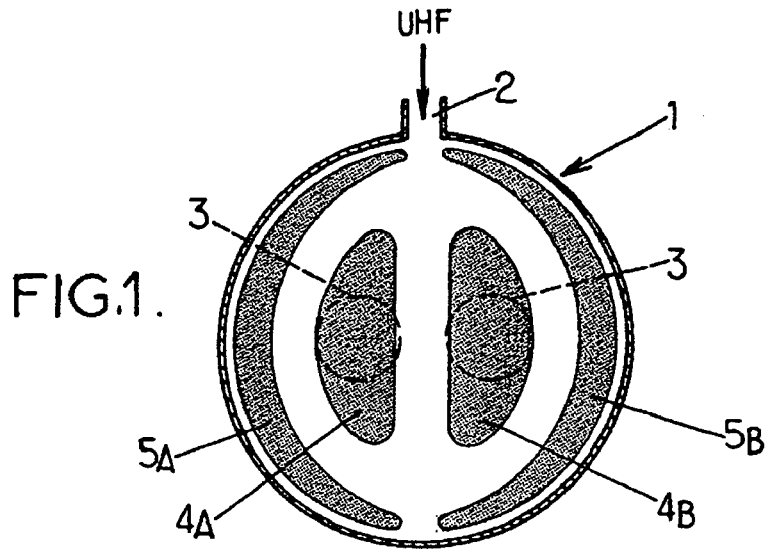
FIG. 1 is a diagram illustrating the conditions under which the method of the invention are carried out.

In one practical embodiment of this arrangement, a TM 120 coupling mode is established, which generates two symmetrical electromagnetic fields, these fields themselves having two separate energy regions, namely two central fields $4_A$ and $4_B$ and two return fields $5_A$, $5_B$ located peripherally, in the shape of haricot beans, facing the inner fields, as illustrated in FIG. 1. The two containers 3 to be treated are placed coaxially in the respective central fields $4_A$, $4_B$. It is also desirable for the positionally adjustable bottom $17i$ and top $17_B$ plates (visible in FIG. 2) to act on the return field $5_A$, $5_B$ in order to refine the coupling to the reactor according to the various types of container 3 capable of being treated.

Under these conditions, the cut-off wavelength is given by:

$$\lambda_c = \frac{2\pi R}{U_{12}}$$

where R is the radius of the chamber and $U_{12}$ characterizing the $T_{120}$ mode has a value $U_{12}=7.0156$.

The cut-off wavelength $\lambda_c$ has a value close to (but slightly greater than) the wavelength $\lambda$ of the generator:

$$\lambda = \frac{v}{f} = \frac{3 \times 10^8}{2,455 \times 10^9} = 12,22 \text{ cm} \rightarrow \lambda_c \text{ \#} 12,225 \text{ cm}$$

The radius R of the chamber is:

$$R = \frac{\lambda_c \times U_{12}}{2\pi} = \frac{12.225 \times 7.0156}{2\pi} = 13.65 \text{ cm.}$$

The chamber therefore has to have a diameter of approximately 273 mm.

The diameter of the chamber 1 thus formed allows two containers, such as two bottles 50 cl in volume or less to be treated simultaneously. By operating in this manner, the treatment capacity of each chamber is doubled. This makes it possible to meet, very favorably, the requirements of users while still maintaining a chamber having dimensions compatible with the rotating structures currently used. In other words, the arrangements according to the invention may be implemented without it being necessary to redesign the entire rotating structure.

Figure 2:
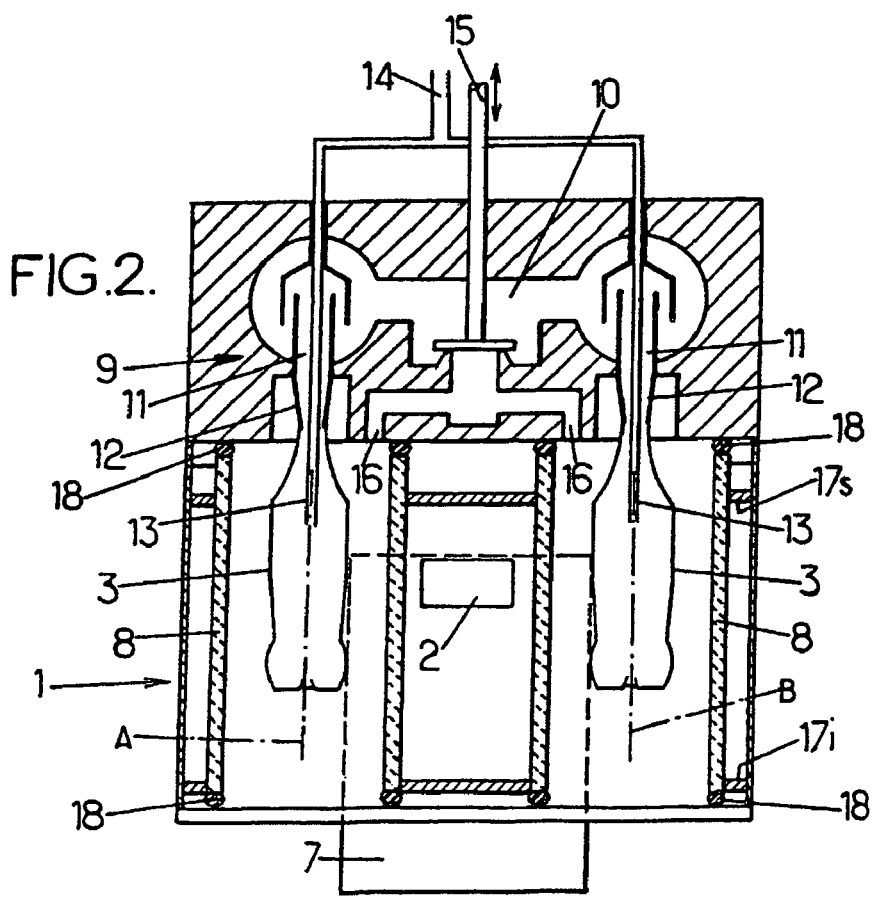
FIG. 2 is a schematic representation of a device for implementing the method of the invention.

FIG. 2 illustrates, in side view, a container treatment device produced around the chamber 1 shown schematically in FIG. 1.

The device shown in FIG. 2, denoted in its entirety by the numerical reference 6, includes a cavity (or reactor) 1 which is a cylinder of revolution having a diameter of approximately 273 mm. The side wall of the chamber 1 has, approximately at mid-height, an opening 2 through which a waveguide (not shown) enters, said waveguide being connected to a UHF generator 7 (largely concealed by the chamber), for example formed by a magnetron, capable of operating at the frequency of 2.455 GHz. This device generates a TM 120 coupling mode with two central fields as illustrated in FIG. 1, these two central fields being centered on the axes A and B shown in FIG. 2.

The arrangement of the device is transposed from that of a device for treating a single container, as described and shown in particular in the abovementioned document FR-A-2 799 994. In particular, two quartz envelopes 8 are placed in the chamber, coaxially with the axes A and B, and inside which envelopes the two respective containers 3 are placed. These two envelopes 8 are mounted in a vacuum-tight manner (with seals 18) in the chamber, each envelope defining a cavity of small volume in which the container may be placed and making it easier to create the vacuum required by the generation of the plasma necessary for depositing the coating in each container.

However, one advantage of the arrangement adopted lies in the fact that the device still requires just one superstructure. In other words, the single cover 9 for the chamber incorporates, on the one hand, the members 10 for supporting the two containers 3 and, on the other hand, the connection means needed for creating the vacuum in the chamber and for injecting the precursor gas needed to form the plasma, and also the internal pressure sensor and the external pressure sensor.

Thus, the cover 9 is provided with an enclosure 10 connected (via a line, not shown in FIG. 2) to a vacuum source, which enclosure 10 extends above the two containers 3 and is in communication at 11 with the inside of the containers. In the example shown, the passage 11 is combined with the means 12 for supporting each container 3.

According to the preferred way of implementing the invention for coating the inside of containers, each passage 11 is penetrated coaxially by a precursor gas injector 13 which sits inside the corresponding container 3. The two injectors 13 may be connected, on the outside of the cover 9, to a single line 14 for connection to a source (not visible in the figures) of precursor gas.

The cover 9 may furthermore be equipped with a valve 15 for bringing the enclosure 10 into communication with ducts 16, either for bringing the inside of the containers 3 into communication with the inside of the envelopes 8 while the vacuum is being created, or for isolating them so as to be able to create differential pressure conditions suitable for generating a plasma in the containers.

In total, the provisions according to the invention, which consist in establishing a TM 120 coupling mode in order to be able to treat two containers simultaneously, prove to be beneficial in the sense that while admittedly it is necessary to duplicate all the elements that cooperate directly with the two containers (i.e. two quartz envelopes, two injectors, two support means, two vacuum orifices), the remainder of the installation nonetheless remains common (i.e. one single cavity, one single UHF generator, one single source and one single feed for the vacuum, one single source and one single feed for the precursor gas, one single internal pressure sensor, one single external pressure sensor, one single cover and therefore one single mechanism for actuating (lowering/raising) the cover, a single mechanism for gripping the containers, in order to hold them in place and for removing them, etc.).

In addition, since there is only one cover 9, there remain only single means for actuating said cover, in order to close/open the chamber 1, such as those mentioned in document FR-A-2 799 994.

In general, the arrangement of the chamber 1 must comply with the symmetry provided by the two central fields $4_A$, $4_B$. In particular, the window 2 through which the waveguide enters the chamber 1 is placed on the axis between the two central fields $4_A$, $4_B$, as may be seen in FIGS. 1 and 2. Likewise, columns for supporting the impedance-matching plates $17_p$, $17_s$ for the respective external fields $5_A$, $5_B$ (these columns not being shown in order not to clutter up the drawings; see for example document FR-A-2 792 854) must be placed symmetrically on either side of the window 2.

The invention claimed is:

1. A method for depositing a coating on one face of several containers made of a thermoplastic using a low-pressure plasma by excitation of a precursor gas by UHF electromagnetic waves in only one circular vacuum chamber containing said containers, said UHF electromagnetic waves being supplied through a window of a side wall of said only one circular vacuum chamber, wherein a frequency of the UHF electromagnetic waves is selected and said only one circular vacuum chamber is sized such that a coupling mode is generated which generates a number of electromagnetic fields inside the only one circular vacuum chamber, and wherein a same number of containers are disposable inside said only one circular vacuum chamber, said-containers being disposable coaxially and respectively within one of said number of electromagnetic fields, whereby it is possible for several respective containers to be simultaneously treated in the only one circular vacuum chamber and wherein the UHF electromagnetic waves have a frequency f=2.455 GHz, and wherein the diameter of said chamber is 273 mm to establish a TM120 coupling mode that generates two central fields in the only one circular vacuum chamber, whereby it is possible for two containers to be simultaneously treated inside said chamber.

2. The method as claimed in claim 1, wherein two containers are disposed inside said only one circular vacuum chamber, said two containers being coaxial respectively to said two electromagnetic fields.

3. A method for depositing a coating on a face of several containers comprising:
    providing a vacuum chamber for containing a plurality of containers;
    placing a plurality of containers within the vacuum chamber;
    supplying a precursor gas into each container;
    exciting the precursor gas to form a low-pressure plasma by supplying UHF electromagnetic waves into the vacuum chamber;
    sizing the vacuum chamber and selecting a frequency of the UHF electromagnetic waves such that the size of the vacuum chamber in combination with the frequency of the UHF electromagnetic waves results in the generation of a coupling mode having a plurality of electromagnetic fields inside the vacuum chamber; and
    wherein each container is disposed respectively and coaxially within one of the plurality of electromagnetic fields generated by the coupling mode, such that multiple containers are simultaneously treated, and wherein the UHF electromagnetic waves have a frequency f=2.455 GHz; and
    wherein the diameter of the vacuum chamber is 273 mm to establish a TM120 coupling mode that generates two central fields in the vacuum chamber;
    whereby it is possible for two containers to be simultaneously treated inside said chamber.

4. The method according to claim 3, wherein the UHF electromagnetic waves are supplied from a single source to generate the plurality of electromagnetic fields.

5. The method according to claim 3, wherein said UHF electromagnetic waves are supplied through a window in a side wall of said chamber.

6. The method according to claim 3, wherein the vacuum chamber is circular.

* * * * *